United States Patent [19]

Mori

[11] Patent Number: 4,889,820

[45] Date of Patent: Dec. 26, 1989

[54] METHOD OF PRODUCING A SEMICONDUCTOR DEVICE

[75] Inventor: Haruhisa Mori, Yokohama, Japan

[73] Assignee: Fujitsu Limited, Kawasaki, Japan

[21] Appl. No.: 321,201

[22] Filed: Mar. 9, 1989

[30] Foreign Application Priority Data

Mar. 14, 1988 [JP] Japan .................................. 63-060127

[51] Int. Cl.⁴ ........................................... H01L 21/265
[52] U.S. Cl. ........................................ 437/29; 437/35; 437/953
[58] Field of Search ....................... 437/28, 29, 30, 35, 437/953; 148/DIG. 18

[56] References Cited

U.S. PATENT DOCUMENTS

| | | | |
|---|---|---|---|
| 3,615,875 | 10/1971 | Morita et al. | 437/35 |
| 4,280,854 | 7/1981 | Shibata et al. | 437/35 |
| 4,382,826 | 5/1983 | Pfleiderer et al. | 437/35 |
| 4,417,385 | 11/1983 | Temple | 437/35 |
| 4,737,471 | 4/1988 | Shirato et al. | 437/44 |

FOREIGN PATENT DOCUMENTS

| | | | |
|---|---|---|---|
| 2341179 | 3/1975 | Fed. Rep. of Germany | 437/35 |
| 59-100574 | 6/1984 | Japan | 437/35 |
| 61-214457 | 9/1986 | Japan | 437/953 |
| 2056168 | 3/1981 | United Kingdom | 437/28 |

Primary Examiner—Olik Chaudhuri
Attorney, Agent, or Firm—Staas & Halsey

[57] ABSTRACT

A method of producing a semiconductor device comprises the steps of: preparing a semiconductor substrate, forming a gate insulating layer on the semiconductor substrate, forming a gate electrode on the gate insulating layer, forming a source/drain region in the semiconductor substrate, forming an insulating cover layer on the entire exposed surface, forming a mask on the insulating cover layer having an opening over the gate electrode, implanting one conductivity type impurity ions into the semiconductor substrate through the insulating cover layer, the gate electrode and the gate insulating layer as a first ion implanting process, implanting opposite conductivity type impurity ions into the semiconductor substrate therethrough as a second implanting process, at an implanting angle larger than that used in the first ion implanting process with respect to the normal plane of the semiconductor substrate and to substantially the same depth as the first ion implanting process, and at a dosage smaller than that in the first ion implanting process, whereby the one conductivity type impurity ions at laterally spread portions are compensated.

12 Claims, 9 Drawing Sheets

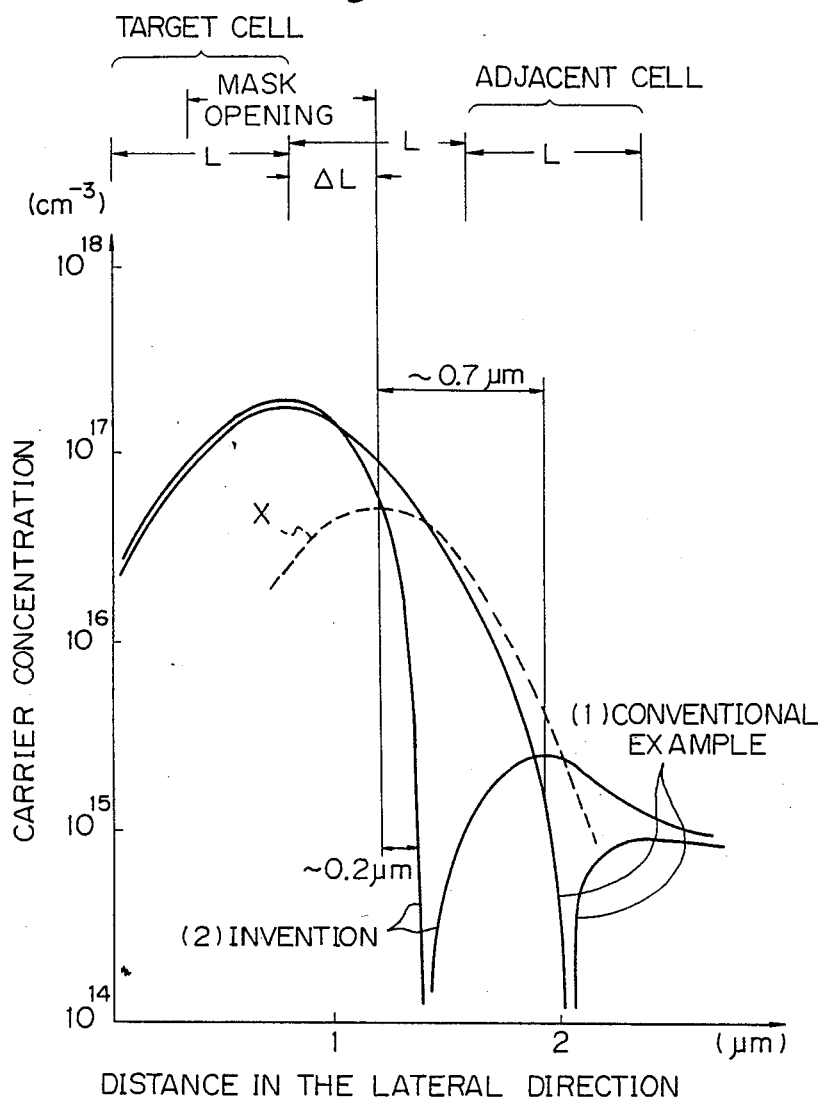

METHOD OF PRODUCING A SEMICONDUCTOR DEVICE

BACKGROUND OF THE INVENTION

1. Field of the Invention

The present invention relates to a method of producing a semiconductor device, and more particularly, to an ion implantation method of writing information in a Read Only Memory (ROM), etc.

2. Description of the Relate Art

As a method of writing information in a ROM, a that of controlling the threshold voltage (Vth) of a MOS transistor is well known. In this ROM, each cell is composed of the MOS transistor or a resistance.

Conventionally, the control of the threshold voltage (Vth) is usually carried out before the gate electrode formation during the MOS transistor production process, due to the limitations (usually 200 KeV or less) of the accelerating energy of the ion implanting apparatus used to introduce impurities into a semiconductor.

Recently, however, an ion implanting apparatus having a high accelerating energy of, e.g., 0.4 to 3 MeV, has been actually used and control of the Vth realized thereby, through a gate electrode and/or an insulating film positioned thereon.

This manner of writing information in a ROM shortens the period (turnaround time) from receipt of an order to shipment of the device. Conventional examples thereof are now explained.

FIGS. 1A to 1C are cross-sectional process views of a conventional method of implanting ions in a ROM.

As shown in FIG. 1A, a p type silicon substrate 1 is provided with n+ source/drain regions 2 and 3 and a gate electrode 4 having a 200 Å thick gate silicon oxide film 5 formed thereon.

Then, as shown in FIG. 1B, after forming a patterning mask 7 by which the gate electrode 4 is exposed, ROM information is written by implanting n type impurity ions, for example, P+, in the silicon substrate 1 through the gate electrode 4 and the gate silicon oxide film 5 with an energy of about 100 to 200 KeV, so that an n-type region having a depth of about 0.2 $\mu$m or less is formed.

Thereafter, the usual processes, for example, a wiring or interconnection forming process and a passivation process, are carried out as shown in FIG. 1C, and a final ROM product, is produced. In FIG. 1C, 8 denotes a passivation film, etc. In this process, however, the turnaround time from information writing to final product is a lengthy period of one week or more.

FIG. 2 shows a cross-sectional view of another conventional example, wherein impurity ions having a high energy are implanted, from above insulating films (passivation film, etc.) 8 formed on a gate electrode 4, in a p-type silicon substrate 1.

Namely, as shown in FIG. 2, n-type impurities, e.g., P+, having a high energy of 0.4 to 3 MeV are implanted from above the passivation films etc. 8 formed on a gate electrode 4, in a p type silicon substrate 1. This high energy implanting method shortens the turnaround time from the ion implanting process to the final product to, for example, two or three days. However, since the implanting distance of ions is lengthened by using the high energy implanting apparatus the ion spread in the lateral direction is made wider (0.7 $\mu$m in FIG. 2) and the widened region has an adverse influence on an adjacent cell when information writing in a cell. This problem has become more serious with the need for a shrinkage of cell in a ROM. Note, when the ion implanting energy is increased, the ion-spread in the lateral direction is greater, and thus, it is difficult to shrink ROM cells beyond a certain limit.

For example, when implanting ions through a SiO$_2$ film or a Si film having a thickness of 1.5 $\mu$m, a width of about 0.2–0.4 $\mu$m occurs to a region having a concentration one-tenth that of the implanting region.

To solve the above-mentioned problem of the widening of ion implanted region in the lateral direction, the present inventor proposed an ion implanting method disclosed in a Japanese Unexamined Patent Publication (Kokai) No. 63-299119 wherein, during a high energy ion implantation, opposite conductive type impurity ions (compensating ions) having a wider region in the lateral direction than that of the writing ions are implanted at a low dose from the opening of the same mask as used for the writing, so that the conductive type is compensated at a tail portion.

Although, this ion implanting process allows a greater shrinkage of cells, the opposite conductive type ions were restricted such that they satisfy only the above-mentioned conditions with respect to the writing ions.

SUMMARY OF THE INVENTION

An object of the present invention is to solve the above-mentioned problems.

A further object of the present invention is to provide a method of producing a semiconductor device such as a ROM, wherein information can be written in a ROM by an ion implanting process using optional ions, in accordance with a design of a cell structure.

A still further object of the present invention is to provide a method of producing a semiconductor device such as ROM, wherein a greater shrinkage of cells can be realized.

An additional object of the present invention is to provide a method of producing a semiconductor device such as a ROM wherein a turnaround time from a ion implantation to produce completion is shortened.

Accordingly, there is provided a method of producing a semiconductor device comprising the steps of:
preparing a semiconductor substrate, forming a gate insulating layer on the semiconductor substrate,
forming a gate electrode o the gate insulating layer,
forming a source/drain region in the semiconductor substrate,
forming an insulating cover layer on the entire exposed surface,
forming a mask on the insulative cover layer having an opening over the gate electrode,
implanting one conductivity type impurity ions into the semiconductor substrate through the insulating cover layer, the gate electrode and the gate insulating layer as a first ion implanting process,
implanting opposite conductivity type impurity ions into the semiconductor substrate therethrough as a second implanting process at an implanting angle larger than that used in the first ion implanting process with respect to the normal plane of the semiconductor substrate and to substantially the same depth as the first ion implanting process and at a dosage smaller than in the first ion implanting process, whereby said one conductivity type impurity ions are compensated at laterally spread portions are compensated.

In these steps, the order of the first ion implanting process and the second ion implanting process can be swapped, of course.

According to the present invention, spread of the implanted writing ions in the lateral direction is prevented by the opposite conductivity type additional and compensating optionally selected ions implanted with a tilted angle.

Although the compensating ion distribution in the substrate can sometimes reach the adjacent cell, the direction of shift of the threshold voltage is opposite to that for the writing ions, and thus the device functions without problem.

Furthermore, even where a writing is effected into the adjacent cell, since ions extended from the target cell have smaller dosage than that of the ions implanted in the cell no problem arises.

According to the present invention, the one conductivity type impurity ions are preferably implanted at an implanting angle of 0° to 7°, particularly 0° with respect to the normal plane of the semiconductor device, at a projective range of 0.5 to 3 $\mu$m, particularly, about 1 to 5 $\mu$m, and a dosage of 1 to $5 \times 10^{13}/cm^2$, particularly about $1.2 \times 10^{13}/cm^2$.

Further, according to the present invention the opposite conductivity type impurity ions are preferably implanted at an implanting angle of larger than 7°; particularly about 10°, at a projective range of 0.5 to 3 $\mu$m particularly about 0.75 MeV, and a dosage of 1 to 5 $-10^{12}/cm^2$, particularly, about $2.5 \times 10^{12}/cm^2$.

BRIEF DESCRIPTION OF THE DRAWINGS

FIG. 4 is a graph illustrating an impurity distribution or profile in the conventional examples shown in FIG. 2;

DESCRIPTION OF THE PREFERRED EMBODIMENTS

The preferred embodiments of the present invention will now be explained with reference to drawings.

Figure 3A:
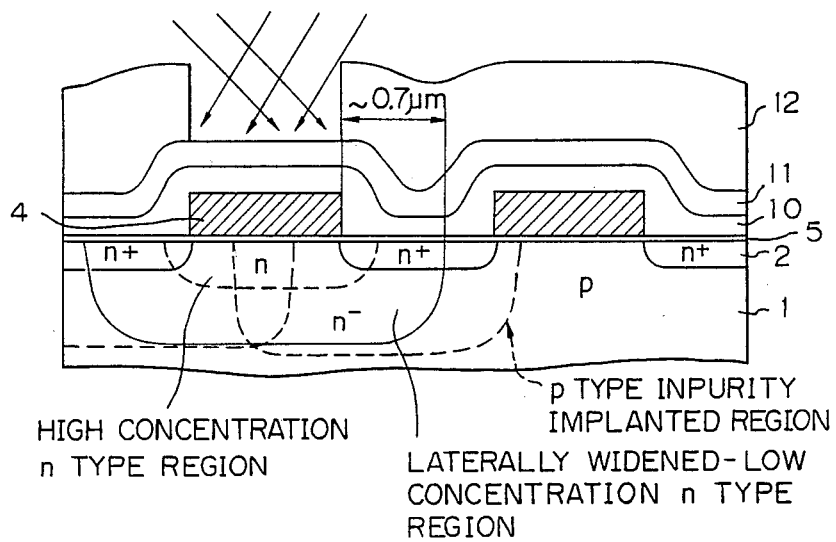
FIGS. 3A and 3B are cross-sectional process views of a ROM cell for explaining an example according to the present invention.
Figure 3B:
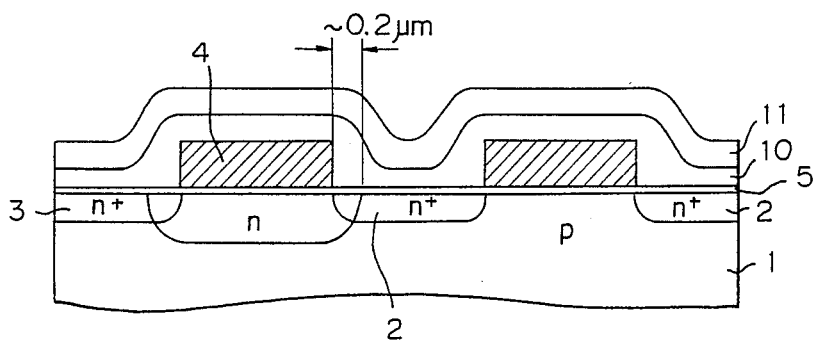

FIGS. 3A and 3B are cross-sectional process views of a ROM cell for explaining an example according to the present invention.

As shown in FIGS. 3A and 3B, a gate electrode 4 provided with a 200 Å thick gate $SiO_2$ film 5 is formed by a usual process on a p type silicon substrate 1 having $n^+$ source/drain regions 2 and 3 of a cell transistor. The gate electrode 4 is made of polycrystalline silicon (poly Si) having a thickness of 4000 Å, and a phospho-silicate glass (PSG) interlayer insulating film 10 having a thickness of 5000 Å and a PSG cover film 11 having a thickness of 6000 Å are formed on the gate electrode 4. The gate length L of the cell transistor is 0.8 $\mu$m and the cell gap D is 0.8 $\mu$m.

Then a mask 12 comprising tungsten 3000 Å and resist 5000 Å, for ion implantation for writing information, is formed on the PSG cover film 11. In this mask formation, a slight deviation ($\Delta L$) between the mask opening and the cell pattern can occur (not shown).

The information is written by controlling a threshold voltage of the cell transistor, as mentioned before. The threshold voltage control is effected by implanting writing ions into a channel forming region of the Si substrate 1 through the insulating films 10 and 11 and the poly Si gate electrode 4 having a total thickness of 1.5 $\mu$m.

Phosphorus ions (P+) having a n conductivity type are used as the writing ions. The P+ ion implanting conditions are as follows: implanting energy, 1.5 MeV, dosage: $1.2 \times 10^{13}/cm^2$, and implanting angle $\theta$: 0°.

Then, as compensating ions, boron ions (B+) having p conductivity type are used. The B+ ion implanting conditions are as follows; implanting energy: 0.75 MeV, dosage: $2.5 \times 10^{12}/cm^{-2}$, and implanting angle $\theta$: 10°.

FIG. 4 is a graph illustrating an impurity distribution or profile of the above conventional examples. In FIG. 4 the ordinate axis is the carrier concentration which is equal to the absolute value of the difference between the n type impurity concentration and the p type impurity concentration at an ordinary temperature, and the transverse axis is distance in a lateral direction.

After the ion implantation, the ions are annealed at a usual temperature of 600°C. or less (in this case, 600°C.), for 30 minutes.

Figure 1A:
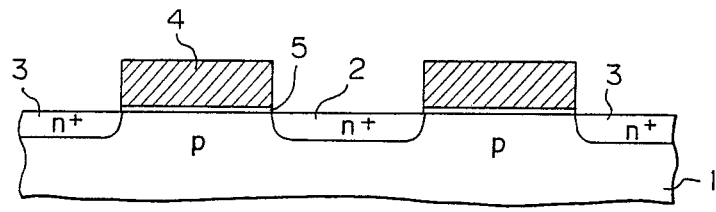
FIGS. 1A to 1C are cross-sectional process views illustrating a conventional method f implanting ions in a ROM.
Figure 1B:
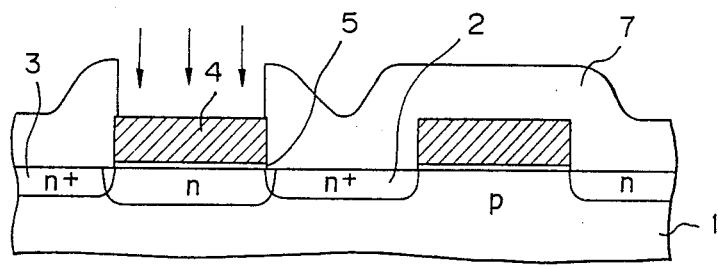
Figure 1C:
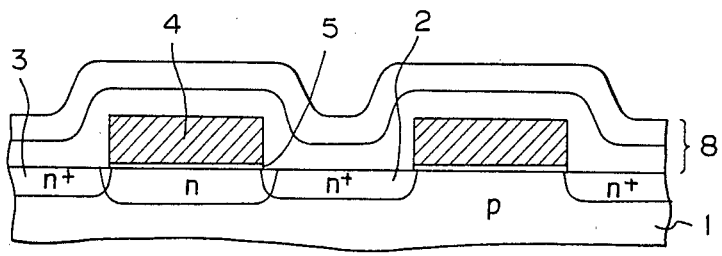
Figure 2:
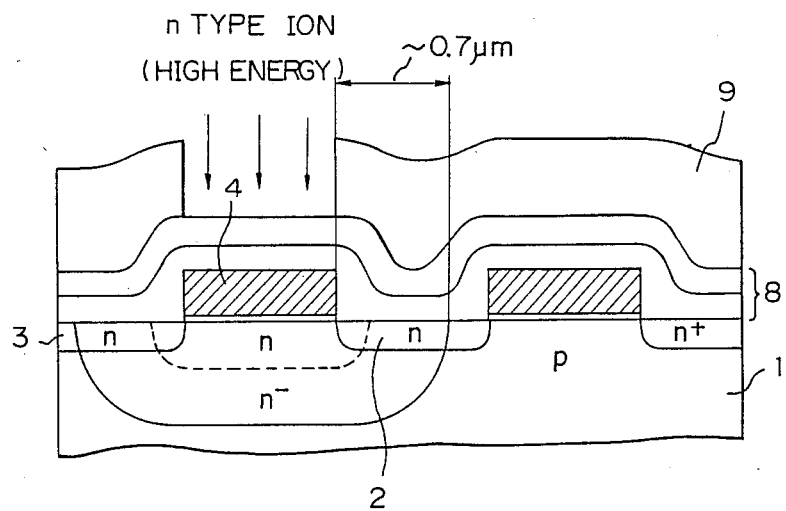
FIG. 2 is a cross-sectional view of another example of a conventional method.

As apparent from FIG. 2, in the conventional example having the implantation conditions: P+ writing ion, energy of 1.5 MeV, dosage of $1 \times 10^{13}/cm^2$, and implanting angle $\theta$ of 0°, the spread in the lateral direction of the implanted ion is about 0.7 $\mu$m, as also shown in FIG. 3A and 4. The distance 0.7 $\mu$m possibly covers a part of the adjacent cell and shifts the threshold voltage to a depression side. This occurs when the mask is deviated and the gap between the cell and the adjacent cell is narrowed.

On the contrary, in the example of the present invention, the carrier concentration in a writing cell is little varied and the distance of the n type region is reduced to 0.2 $\mu$m by the distribution (broken line X) of Boron (B+) having the opposite conductivity type to that of P+, so that the n type region does not reach the adjacent cell.

These ion distributions of the n type impurity (P+), which is implanted in a conventional way, and the P type impurity (B+) which is additionally implanted with a tilted angle are also shown in FIG. 3A.

In FIG. 3, the laterally spread low concentration n type region is reversed to a p type region by implanting p type ions with a tilted angle, and thus as shown in FIG. 3B, an n type region having a lesser spread is formed as information written in a ROM cell.

Figure 5A:
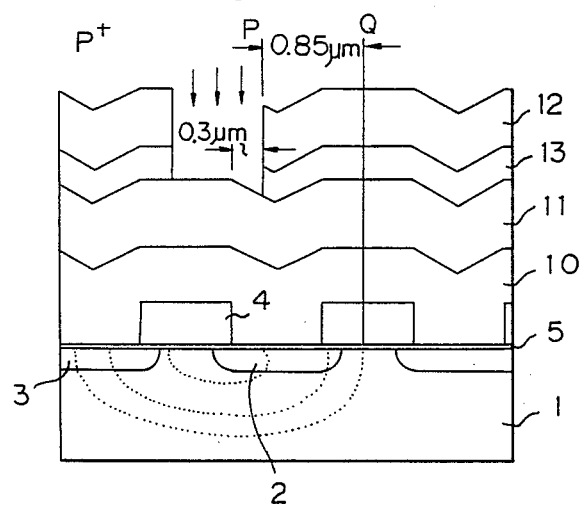
FIGS. 5A to 5C are cross-sectional views taken along the line AA of FIG. 7, for explaining another example of the present invention.
Figure 5B:
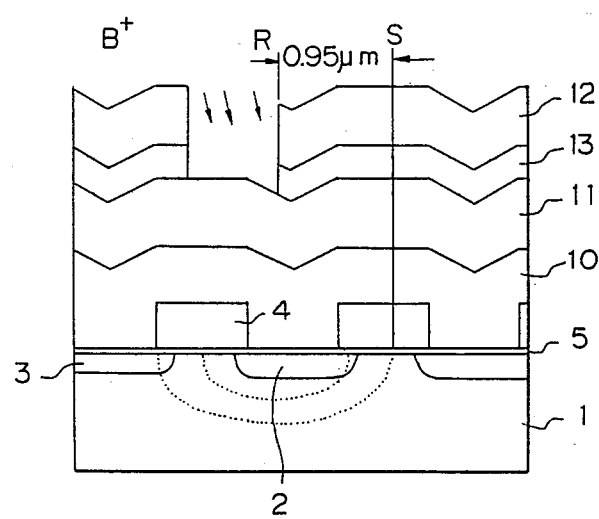
Figure 5C:
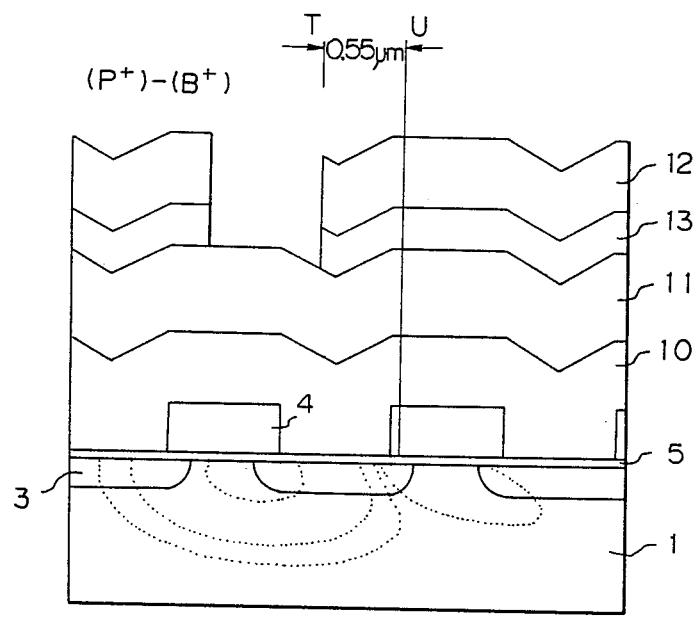
Figure 7:
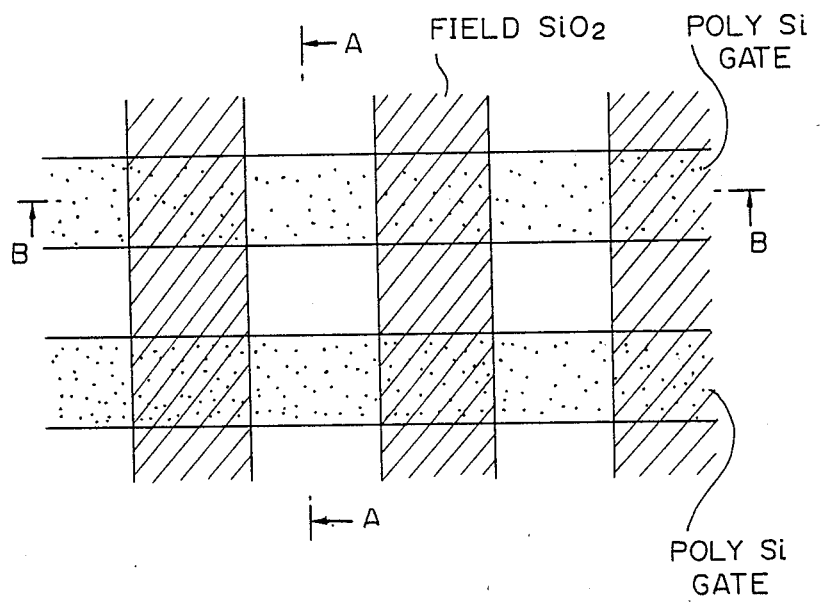

FIGS. 5A to 5C are cross-sectional views taken along the line AA of FIG. 7, for explaining another example of the present invention.

Particularly FIG. 5A shows a P+ ion (writing ion) implanted state in a p type silicon substrate 1, FIG. 5B shows a B+ ion (compensating ion) implanted state, and FIG. 5C shows a (P+)−(B+), i.e., compensated, state.

As shown in FIGS. 5A to 5C, except that the openings in the resist mask 12 and the tungsten mask 13 are slightly deviated (e.g., 0.3 μm) to the right side, the various conditions (e.g., ion implantation and thickness) are substantially the same as shown in the example of FIGS. 3A and 3B.

The P+ (n type) ion implanted width in the lateral direction from P to Q (FIG. 5A) is about 0.85 μm, and the B+ (p type) ion implanted spread in the lateral direction from R to S (FIG. 5B) is about 0.95 μm. The compensated ion implanted spread in the lateral direction T to U is about 0.55 μm, and thus is reduced by 0.3 μm.

Figure 6A:
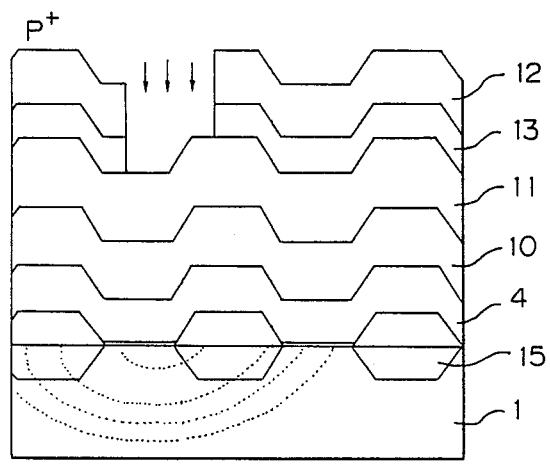
FIGS. 6A to 6C are cross-sectional views taken along the line BB of FIG. 7 for explaining another example of the present invention; and, FIG. 7 is a plane view for explaining another example of the present invention.
Figure 6B:
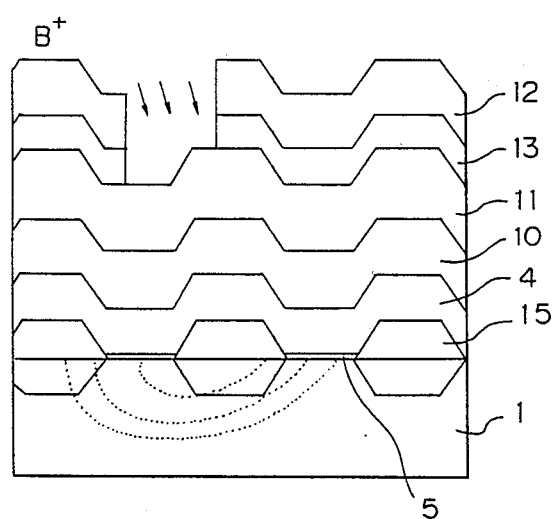
Figure 6C:
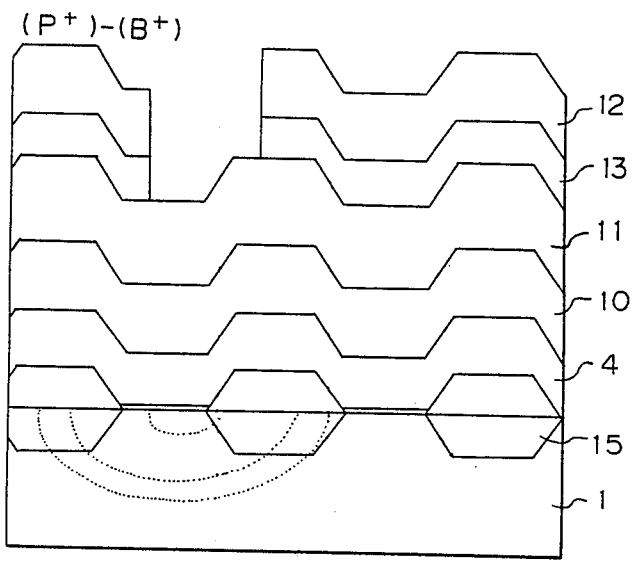

FIGS. 6A to 6C are cross-sectional views taken along the line BB of FIG. 7 for explaining another example of the present invention.

Particularly FIG. 6A shows a P+ ion (writing ion) implanted state, FIG. 6B shows a B+ ion (compensating ion) implanted state, and FIG. 6C shows a (P+)−(B+) i.e., compensated, state.

In FIGS. 6A to 6C, except that the openings in the resist mask 12 and the tungsten mask 13 are slightly deviated (e.g., 0.3 μm) to the right side, the various conditions (e.g., ion implantation, and thickness) are substantially the same as in the example shown in FIGS. 3A and 3B.

In FIGS. 6A to 6C, a field oxide film (SiO$_2$) 15 having a thickness of 6000 °Å is provided, and as can be seen in FIGS. 6A to 6C, the compensated ion spread in the lateral direction is reduced by about 0.45 μm, and thus the spread thereof does not cover the adjacent cell.

I claim:

1. A method of producing a semiconductor device comprising the steps of:
   preparing a semiconductor substrate,
   forming a gate insulating layer on the semiconductor substrate,
   forming a gate electrode on the gate insulating layer,
   forming a source/drain region in the semiconductor substrate,
   forming an insulating cover layer on the entire exposed surface,
   forming a mask on the insulating cover layer having an opening over the gate electrode,
   implanting one conductivity type impurity ions into the semiconductor substrate through the insulating cover layer, the gate electrode and the gate insulating layer as a first ion implanting process,
   implanting opposite conductivity type impurity ions into the semiconductor substrate therethrough as a second implanting process at an implanting angle larger than that of the first ion implanting process with respect to the normal plane of the semiconductor substrate and to substantially the same depth as in the first ion implanting process and at a dosage smaller than in the first ion implanting process, whereby said one conductivity type impurity ions at laterally spread portions are compensated.

2. A method according to claim 1, wherein said semiconductor substrate is a p type silicon substrate.

3. A method according to claim 1, wherein said gate electrode is a polycrystalline silicone electrode having a thickness of about 4000 Å.

4. A method according to claim 1, wherein said insulating cover layer positioned on the entire exposed surface is composed of two phospho-silicate glass layers having a total thickness of 1.1 μm.

5. A method according to claim 1, wherein said one conductivity type impurity ions are n type impurity ions.

6. A method according to claim 5, wherein said n type impurity ions are phosphorus ions (P+).

7. A method according to claim 1, wherein said one conductivity type impurity ions are implanted at an implanting angle of 0° to 7° with respect to the normal plane of the semiconductor device.

8. A method according to claim 1, wherein said one conductivity type impurity ions are implanted at a projective range of 0.5 to 3 μm and a dosage of 1 to 5 ×10$^{13}$/cm$^2$.

9. A method according to claim 1, wherein said opposite conductivity type impurity ions are p type impurity ions.

10. A method according to claim 9, wherein said p type impurity ions are boron ions (B+).

11. A method according to claim 1, wherein said opposite conductivity type impurity ions are implanted at an implanting angle of larger than 7° with respect to the normal plane of the semiconductor device.

12. A method according to claim 1, wherein said opposite conductivity type impurity ions are implanted at a projective range of 0.5 to 3 μm and a dosage of 1 to 5×10$^{12}$/cm$^2$.

* * * * *

UNITED STATES PATENT AND TRADEMARK OFFICE
CERTIFICATE OF CORRECTION

PATENT NO. : 4,889,820            Page 1 of 2

DATED : December 26, 1989

INVENTOR(S) : Haruhisa MORI

It is certified that error appears in the above-identified patent and that said Letters Patent is hereby corrected as shown below:

Col. 1,     line 11, change "Relate" to --Related--;

line 12, change "a that" to --that--.

Col. 2,     line 42, before "ion" delete "a";

line 43, change "produce" to --product--;

line 48, change "o" to --on--;

line 53, change "insulative" to --insulating--.

Col. 3,     line 2, change "tions are compensated." to --tions.--;

line 32, "$-10^12/cm_2$" to --$x10^12/cm2$--;

line 36, change "f" to --of--.

UNITED STATES PATENT AND TRADEMARK OFFICE
CERTIFICATE OF CORRECTION

PATENT NO.  : 4,889,820

DATED       : December 26, 1989

INVENTOR(S) : Haruhisa MORI

It is certified that error appears in the above-identified patent and that said Letters Patent is hereby corrected as shown below:

Col. 5, line 10, change "T to U is" to --from T to U (FIG. 5C) is--.

Col. 6, line 14, change "silicone" to --silicon--.

Signed and Sealed this

Twelfth Day of March, 1991

Attest:

HARRY F. MANBECK, JR.

*Attesting Officer*  *Commissioner of Patents and Trademarks*

UNITED STATES PATENT AND TRADEMARK OFFICE
CERTIFICATE OF CORRECTION

PATENT NO. : 4,889,820

DATED : December 26, 1989

INVENTOR(S) : Haruhisa Mori

It is certified that error appears in the above-identified patent and that said Letters Patent is hereby corrected as shown below:

Correction in column 4, line 23

"$cm^{-2}$" should be "$cm^{2}$".

Signed and Sealed this

Twenty-eighth Day of April, 1992

Attest:

HARRY F. MANBECK, JR.

*Attesting Officer*      *Commissioner of Patents and Trademarks*